(12) United States Patent
Ishikawa et al.

(10) Patent No.: US 8,883,404 B2
(45) Date of Patent: Nov. 11, 2014

(54) PROCESS FOR PRODUCING A LIQUID EJECTION HEAD

(71) Applicant: Canon Kabushiki Kaisha, Tokyo (JP)

(72) Inventors: Tetsushi Ishikawa, Tokyo (JP); Tamaki Sato, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/146,463

(22) Filed: Jan. 2, 2014

(65) Prior Publication Data

US 2014/0193756 A1 Jul. 10, 2014

(30) Foreign Application Priority Data

Jan. 7, 2013 (JP) ................. 2013-000582

(51) Int. Cl.
*B41J 2/16* (2006.01)
(52) U.S. Cl.
USPC ............................................. 430/320
(58) Field of Classification Search
None
See application file for complete search history.

(56) References Cited

U.S. PATENT DOCUMENTS

| | | | |
|---|---|---|---|
| 7,971,964 B2 | 7/2011 | Shiba et al. | |
| 2009/0315950 A1* | 12/2009 | Horiuchi | 347/54 |
| 2010/0233630 A1* | 9/2010 | Watanabe et al. | 430/320 |
| 2010/0255424 A1 | 10/2010 | Shiba et al. | |
| 2013/0288183 A1 | 10/2013 | Ishikawa et al. | |

FOREIGN PATENT DOCUMENTS

| | | | |
|---|---|---|---|
| JP | 2010-115829 A | * | 5/2010 |
| JP | 2010-131954 A | | 6/2010 |

OTHER PUBLICATIONS

Computer-generated translation of JP 2010-115829 (May 2010).*

* cited by examiner

*Primary Examiner* — John A. McPherson
(74) *Attorney, Agent, or Firm* — Fitzpatrick, Cella, Harper & Scinto (57) ABSTRACT

A process for producing a liquid ejection head including, on a substrate, a flow path forming member forming ejection orifices and a liquid flow path communicating therewith, including forming, on the substrate, a first layer of photosensitive resin; forming, on the first layer, a mask layer in which at least part of a side surface thereof has a light transmission distribution with a material capable of reducing transmission of light having a photosensitive wavelength of the resin; performing, for the first layer, exposure with the mask layer and development to form a flow path mold pattern having a taper angle $\theta$ satisfying $95° < \theta$, where $\theta$ is the angle between top and side surfaces in cross section of the pattern perpendicular to substrate surface; forming a coating resin layer to cover the pattern; patterning the resin layer to form the member; and removing the pattern to form the flow path.

6 Claims, 7 Drawing Sheets

PROCESS FOR PRODUCING A LIQUID EJECTION HEAD

BACKGROUND OF THE INVENTION

1. Field of the Invention

The present invention relates to a process for producing a liquid ejection head.

2. Description of the Related Art

A recording apparatus (liquid ejection apparatus) using an ink jet system has a configuration for performing recording by ejecting an ink (recording liquid) droplet from an ejection orifice of a nozzle of a recording head and causing the ink droplet to adhere to a recording medium.

A configuration of the liquid ejection head of this type is described below. The liquid ejection head includes a silicon substrate in which electric wiring, ejection energy generating elements for generating energy for ejecting ink, and the like are provided on a surface thereof. On the silicon substrate, multiple nozzles are provided. Each of the nozzles includes a bubble generating chamber for generating a bubble using the ejection energy generating element, a minute ejection orifice for ejecting ink droplets, a flow path for supplying ink, and the like. Further, the silicon substrate has an ink supply port provided therein for supplying ink from the outside so as to pass through a front surface and a rear surface of the silicon substrate. As for the ink supply port, there are known a configuration in which ink is directly supplied from a common liquid chamber to the nozzles, and a configuration in which ink is supplied from the common liquid chamber to the nozzles via independent supply ports.

In the liquid ejection head having the configuration described above, ink supplied from the rear surface side of the silicon substrate is supplied through the ink supply port to the respective nozzles, and is filled in the bubble generating chamber. The ink filled in the bubble generating chamber is ejected in a direction substantially orthogonal to the silicon substrate due to a bubble generated through film boiling by the ejection energy generating element. In this manner, ink droplets are ejected from the ejection orifice.

In Japanese Patent Application Laid-Open No. 2010-131954, on a substrate, a positive photosensitive resin is formed to be used as a pattern corresponding to a shape of a liquid flow path. When the positive photosensitive resin is exposed to light, an exposure apparatus for exposing the entire substrate to light at one time at a magnification of 1 to 1 is used because of a required exposure amount. The exposure apparatus performs exposure at one time, and hence the accuracy of alignment between the substrate and a mask may be insufficient. In particular, as the substrate is upsized, the alignment accuracy may vary within the same substrate or depending on the substrate due to warpage of the substrate or the like. In Japanese Patent Application Laid-Open No. 2010-131954, as a countermeasure for such a problem, a mask layer capable of reducing transmission of light having a photosensitive wavelength is provided on a part of a photosensitive resin layer corresponding to the liquid flow path, and the photosensitive resin layer is exposed to light at one time with use of the mask layer as a mask, to thereby form a desired flow path mold in the photosensitive resin layer. The mask layer can be patterned with high positional accuracy with use of the most widely-used i-line (365 nm) stepper having high alignment accuracy. Along therewith, the positional accuracy of patterning in the photosensitive resin is also improved. After that, a layer that becomes a nozzle member is provided so as to cover the liquid flow path pattern, and then ejection orifices are formed in parts of the layer. Then, the flow path pattern is removed. Thus, the liquid ejection head is produced.

SUMMARY OF THE INVENTION

According to an embodiment of the present invention, there is provided a process for producing a liquid ejection head including, on a substrate, a flow path forming member that forms an ejection orifice for ejecting liquid and a liquid flow path communicating with the ejection orifice, the process including: (1) forming, on the substrate, a first layer made of a first photosensitive resin; (2) forming, on the first layer, a mask layer in which at least a part of a side surface part of the mask layer has a light transmission distribution with use of a material capable of reducing transmission of light having a photosensitive wavelength of the first photosensitive resin; (3) performing, for the first layer, a first exposure treatment with use of the mask layer as a mask and a first development treatment to form a flow path mold pattern that forms a mold of the liquid flow path, the flow path mold pattern having a taper angle θ that satisfies 95°<θ, where θ is the angle between a top surface and a side surface in a cross section of the flow path mold pattern perpendicular to a surface of the substrate; (4) forming a coating resin layer so as to cover the flow path mold pattern; (5) patterning the coating resin layer so as to form the flow path forming member having the ejection orifice; and (6) removing the flow path mold pattern to form the liquid flow path.

Further features of the present invention will become apparent from the following description of exemplary embodiments with reference to the attached drawings.

DESCRIPTION OF THE EMBODIMENTS

When the method described in Japanese Patent Application Laid-Open No. 2010-131954 is used, exposure of a photosensitive resin that forms a flow path mold is contact exposure performed via a layer as a mask. Therefore, the pattern edge of the flow path mold tends to be formed at a substantially right angle. This pattern edge mold is transferred onto a nozzle member, and hence a similar corner is formed on a flow path wall inside the nozzle member. In the case of the mold described above, when an external force is applied, an excess stress is concentrated near the corner, and hence failure such as cracks may be generated depending on the thickness of the nozzle member.

In view of the above, the present invention provides a process for producing a liquid ejection head, which is capable of controlling the position of a liquid flow path with high accuracy and capable of relaxing stress concentration to prevent generation of cracks.

The present invention relates to a process for producing a liquid ejection head including, on a substrate, a flow path forming member that forms an ejection orifice for ejecting liquid and a liquid flow path communicating with the ejection orifice.

Further, the present invention includes a step of forming, on the substrate, a first layer made of a first photosensitive resin.

Further, the present invention includes a step of forming, on the first layer, a mask layer (also referred to as "mask pattern") in which at least a part of a side surface part thereof has a light transmission distribution with use of a material capable of reducing transmission of light having a photosensitive wavelength of the first photosensitive resin.

In this case, the description "a side surface part thereof has a light transmission distribution" indicates that the side surface part of the mask layer in a cross section thereof perpendicular to the substrate surface has a property or mold that increases in light transmission toward the end of the pattern.

A method of forming the mask layer is described later in detail by way of embodiments.

Further, the present invention includes a step of performing, for the first layer, a first exposure treatment with use of the mask layer as a mask and a first development treatment to form a flow path mold pattern that forms a mold of the liquid flow path.

In this case, when θ represents a taper angle between a top surface and a side surface in a cross section of the flow path mold pattern perpendicular to the substrate surface, 95°<θ is satisfied, preferably 100°<θ, more preferably 105°<θ. Further, θ<150° is preferably satisfied, more preferably θ<130°.

Further, the present invention includes a step of forming a coating resin layer so as to cover the flow path mold pattern, and a step of patterning the coating resin layer so as to form the flow path forming member having the ejection orifice.

Further, the present invention includes a step of removing the flow path mold pattern to form the liquid flow path.

Figure 1A:
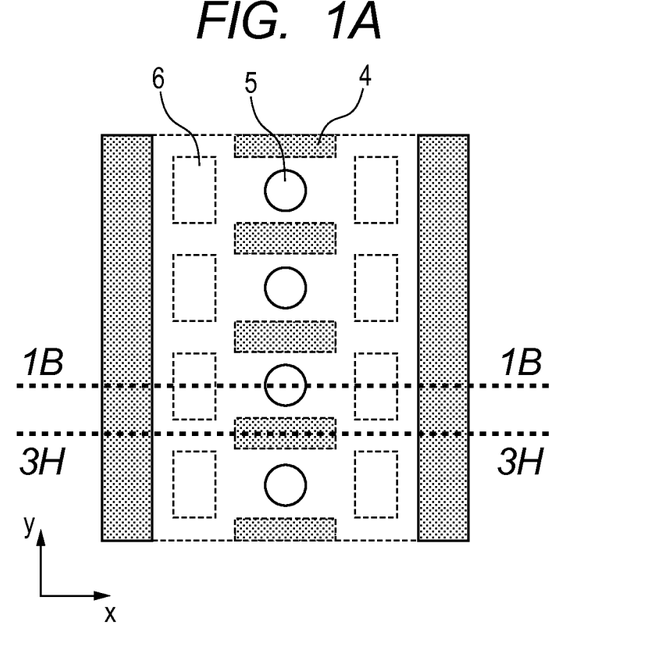
FIGS. 1A and 1B are respectively a schematic top view and a schematic perspective view illustrating a configuration example of a liquid ejection head obtained through a producing process according to each embodiment of the present invention.
Figure 1B:
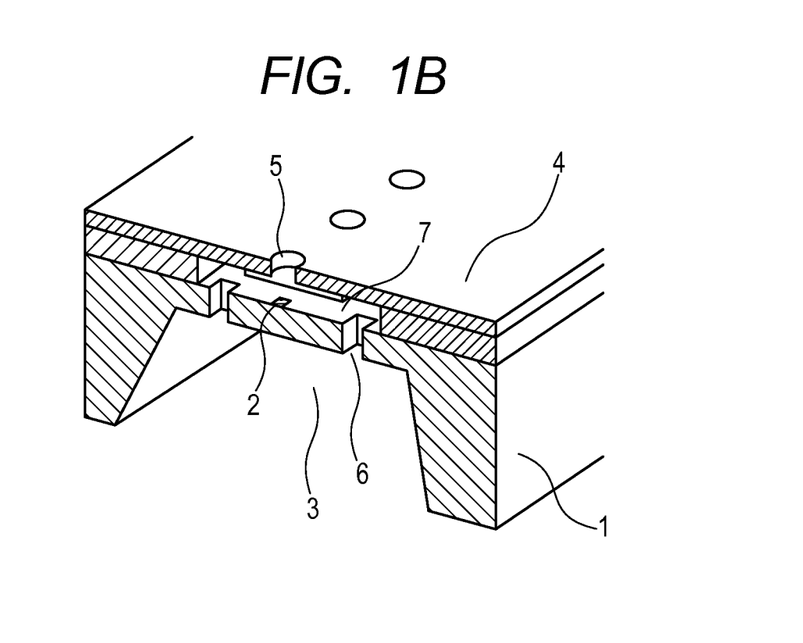

FIGS. 1A and 1B are respectively a top view and a sectional perspective view illustrating a configuration example of a liquid ejection head. FIG. 1A is a schematic top view illustrating the configuration on an ejection surface side. FIG. 1B is a schematic sectional perspective view having a cross section taken along the line 1B-1B of FIG. 1A. In the following, embodiments of the present invention are described with reference to FIGS. 1A and 1B, but the present invention is not limited merely to the description below.

Further, an ink jet recording head is herein mainly described as an application example of the present invention. However, the application range of the present invention is not limited thereto, and the present invention is also applicable to a recording head for biochip fabrication or electronic circuit printing application. As the recording head, for example, a head for producing a color filter may be exemplified other than the ink jet recording head.

Note that, a liquid ejection head obtained by the present invention can be mounted on an apparatus such as a printer, a copying machine, a facsimile machine, or a word processor having a printer unit, or an industrial recording apparatus combined with a processor of various kinds. The liquid ejection head obtained by the present invention can also be used in, for example, an apparatus for manufacturing a biochip, for printing an electronic circuit, or for spraying a chemical.

The liquid ejection head illustrated in FIGS. 1A and 1B includes a substrate 1 in which ejection energy generating elements 2 for generating energy for ejecting liquid such as ink are formed at a predetermined pitch. On a rear surface (second surface) side of the substrate 1, a common liquid chamber 3 for supplying liquid is provided. In a bottom surface of the common liquid chamber 3, multiple independent supply ports 6 are formed so as to pass through the substrate to reach a front surface (first surface) thereof. On the front surface side of the substrate 1, a flow path forming member 4 forming a liquid flow path 7 and ejection orifices 5 is provided. The ejection orifices 5 open above the ejection energy generating elements 2. The flow path forming member includes a flow path wall member for forming walls of the individual liquid flow path 7 communicating from the independent supply port 6 to each of the ejection orifices 5, and an ejection orifice forming member for forming walls of the ejection orifices 5. The flow path wall member and the ejection orifice forming member are formed integrally with each other.

Now, a producing process according to each embodiment of the present invention is described in detail.

First Embodiment

FIGS. 2A to 2H are sectional views illustrating steps of a producing process according to a first embodiment of the present invention, and are schematic sectional views taken along the line 1B-1B of FIG. 1A. In the following, this embodiment is described with reference to FIGS. 2A to 2H.

Figure 2A:
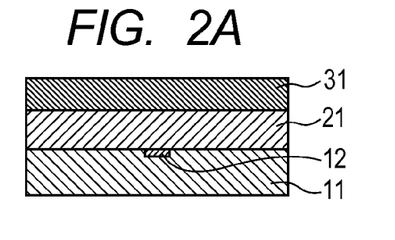
FIGS. 2A, 2B, 2C, 2D, 2E, 2F, 2G and 2H are sectional views illustrating exemplary steps of a producing process according to a first embodiment of the present invention.

First, as illustrated in FIG. 2A, on a substrate 11 having an ejection energy generating element 12 formed on a first surface (front surface) thereof, a first layer 21 made of a first photosensitive resin is formed. Next, a second layer 31 made of a second photosensitive resin capable of reducing transmission of light having a photosensitive wavelength of the first photosensitive resin is formed.

A positive photosensitive resin and a negative photosensitive resin may be used as the first photosensitive resin to be used for the first layer 21. Examples of the positive photosensitive resin include a main-chain-decomposition-type positive photosensitive resin, i.e., polymethyl isopropenyl ketone and polyvinyl ketone, as well as a main-chain-decomposition-type positive photosensitive resin of a polymer including a methacrylic acid ester as a main component. In addition, other examples thereof may include a homopolymer such as polymethyl methacrylate and polyethyl methacrylate; and a copolymer of methyl methacrylate and methacrylic acid, acrylic acid, glycidyl methacrylate or phenyl methacrylate.

The second layer 31 serves as a mask layer (mask pattern) to be used as a mask when the first layer is exposed to light in the subsequent step. Any material may be used as the second photosensitive resin for the second layer 31 as long as the material can reduce transmission of light having the photosensitive wavelength of the first photosensitive resin. Further, it is preferred that the second photosensitive resin be a material that can be patterned with use of a stepper from the viewpoint of alignment accuracy, and it is more preferred that the second photosensitive resin be a material that can be patterned by the i-line (365 nm), which is most widely used. A specific material thereof is a positive photoresist formed of a novolac resin and a naphthoquinonediazide derivative. Examples of such positive photoresist include OFPR-800 (product name) and THMR-iP5700 (product name) manufactured by TOKYO OHKA KOGYO CO., LTD. In addition, the second photosensitive resin may include a hydroxybenzophenone compound in order to improve light shielding property. Examples of the hydroxybenzophenone compound include 2-hydroxy-4-octoxybenzophenone, 2-hydroxy-4-methoxybenzophenone, and 2,4-dihydroxybenzophenone as well as 2,3,4-trihydroxybenzophenone, 2,3,4,4'-tetrahydroxybenzophenone, and 2,3',4,4'-tetrahydroxybenzophenone. For complete light shielding, the second layer is required to have a high absorbance in a photosensitive wavelength region of the first photosensitive resin. From the viewpoint of complete light shielding, the absorbance of the second layer is preferred to be 2 or more. The optimum type of the second photosensitive resin differs depending on the type of the first photosensitive resin, and hence those materials are desired to be appropriately selected.

Figure 2B:
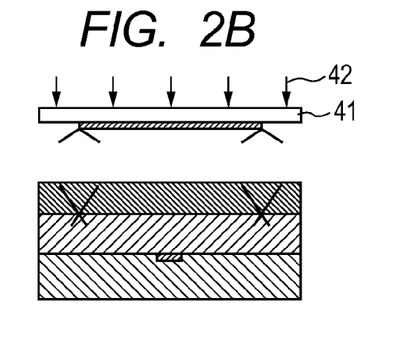

Next, as illustrated in FIG. 2B, the second layer 31 made of the second photosensitive resin is subjected to a second exposure treatment via a mask 41 with second exposure light 42 having a photosensitive wavelength of the second photosensitive resin.

Figure 2C:
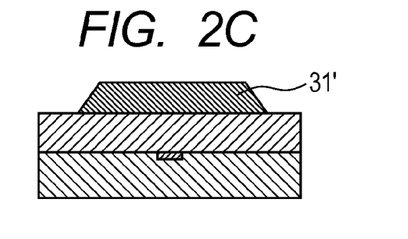

Next, as illustrated in FIG. 2C, the second layer 31 subjected to the second exposure treatment is subjected to a second development treatment, to thereby form a mask layer 31' in which at least a part of a side surface part thereof has a light transmission distribution.

The second exposure treatment can be carried out through imaging exposure using an imaging exposure apparatus, such as reflection projection exposure, unit-magnification projection exposure, and reduction projection exposure.

From the viewpoint of high alignment accuracy, it is preferred that an i-line (365 nm) stepper be used to apply the second exposure light 42.

During the second exposure treatment, in order to provide a light transmission distribution in the side surface part of the mask layer formed of the second layer 31, for example, an imaging position can be controlled in the projection exposure. With this, the end portion of the mask layer formed of the second layer 31 can be formed into a tapered shape. Specifically, the second exposure is performed so that the imaging position is located at a position on the substrate side with respect to the front surface of the second layer 31 (on a lower side with respect to the top surface of the second layer 31 in FIG. 2B). In this manner, the tapered shape of the mask layer is achieved. That is to say, imaging exposure is performed in such a manner that the imaging position is shifted from the front surface of the second layer toward the substrate side to achieve the tapered shape of the mask layer. Further, in addition to adjustment of the imaging position, the numerical aperture (NA) and the coherence factor ($\sigma$) during exposure are increased so that the inclination angle can be adjusted more sensitively. The imaging position is not particularly limited, but, for example, may be set within a range of 10 µm to 20 µm from the front surface (top surface in FIG. 2B) of the second layer toward the substrate side.

As described above, the side surface part of the mask layer 31' has a tapered shape, and the mask layer has a side surface that is inclined from a top surface end portion toward a lower surface end portion. When $\theta_1$ represents a taper angle between the top surface and the side surface in a cross section of the mask layer perpendicular to the substrate surface, for example, $95° < \theta_1$ is satisfied, preferably $100° < \theta_1$, more preferably $105° < \theta_1$. Further, for example, $\theta_1 < 180°$ is satisfied, preferably $\theta_1 < 150°$, more preferably $\theta_1 < 130°$.

Figure 2D:
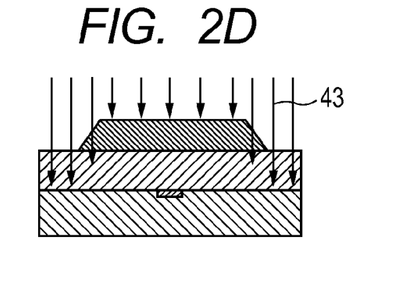

Next, as illustrated in FIG. 2D, the first layer 21 is subjected to a first exposure treatment with use of the mask layer 31' as a mask with a first exposure light 43 having a photosensitive wavelength of the first photosensitive resin.

Figure 2E:
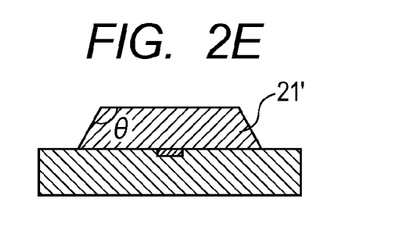

Next, as illustrated in FIG. 2E, the first layer 21 subjected to the first exposure treatment is subjected to a first development treatment, and thus a flow path mold pattern 21' in which at least a part of a side surface thereof is inclined is formed.

The taper angle $\theta$ is as described above.

When the side surface part of the mask layer 31' is tapered, in other words, a taper angle is formed, absorption in proportion to the film thickness distribution occurs in the side surface part of the mask layer 31', and hence the first layer 21 can be exposed to light with an exposure amount distribution provided. Then, when the exposure amount distribution is provided in the first layer 21, the thickness of the photosensitive resin is reduced in accordance with the exposure amount in the development treatment, and hence the side surface of the flow path mold pattern 21' is formed into a tapered shape having a taper angle $\theta$ ($95° < \theta$). Note that, the transmission distribution of the side surface part of the mask layer can be adjusted by the above-mentioned method so that $\theta$ exceeds $95°$.

Note that, the mask layer 31' can be removed at an appropriate timing after the first exposure treatment, and can be removed simultaneously with development by the first development treatment.

Further, baking treatment after the patterning, asking of the edge portion, or extension of the time period for development is effective from the viewpoint of stress concentration relaxation because the corner of the edge portion of the flow path mold pattern can be rounded.

Figure 2F:
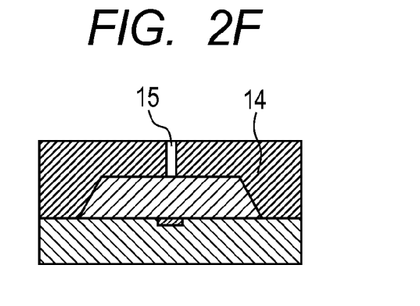

Next, as illustrated in FIG. 2F, a coating resin layer is formed on the flow path mold pattern 21'. Then, the coating resin layer is patterned to form a flow path forming member 14 having an ejection orifice 15.

The coating resin layer can be made of a third photosensitive resin, and can be patterned through exposure treatment and development treatment. As the third photosensitive resin, for example, a negative photosensitive resin can be used.

Figure 2G:
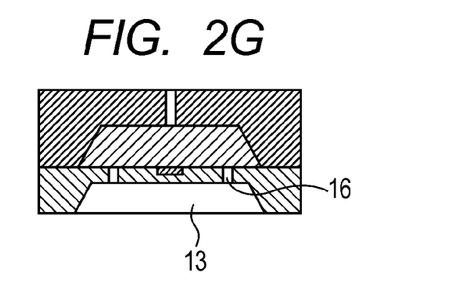

Next, as illustrated in FIG. 2G, etching is performed from the rear surface (second surface) side of the substrate to form a liquid supply port for supplying liquid to the liquid flow path.

In FIGS. 2A to 2H, the liquid supply port includes a common supply port 13 and multiple independent supply ports 16. For example, the common supply port 13 can be formed by crystal anisotropic etching of the silicon substrate, and the independent supply ports 16 can be formed by dry etching such as reactive ion etching.

Figure 2H:
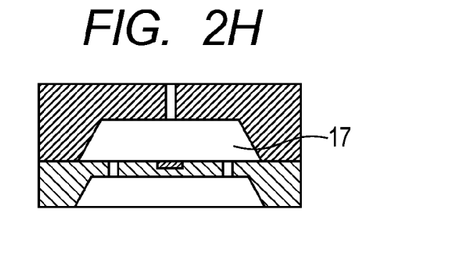

Next, as illustrated in FIG. 2H, the flow path mold pattern 21' is dissolved and removed. Thus, the liquid ejection head having the configuration illustrated in FIGS. 1A and 1B is produced.

A curing step may be performed after the flow path mold pattern is removed.

Second Embodiment

FIGS. 3A to 3H are sectional views illustrating steps of a producing process according to a second embodiment of the present invention, and are schematic sectional views taken along the line 3H-3H of FIG. 1A. In the following, this embodiment is described with reference to FIGS. 3A to 3H.

Figure 3A:
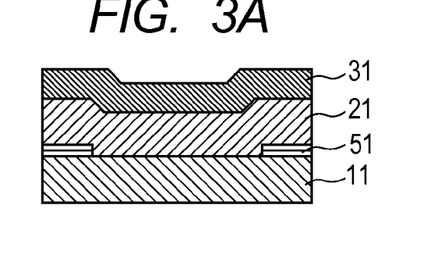
FIGS. 3A, 3B, 3C, 3D, 3E, 3F, 3G and 3H are sectional views illustrating exemplary steps of a producing process according to a second embodiment of the present invention.

In this embodiment, when a pattern 51 such as wiring or an adhesion layer is present, the first layer 21 that forms a mold of the flow path in the subsequent step follows an underlying shape to have a film thickness distribution as illustrated in FIG. 3A. Further, when the coating resin layer formed so as to cover the flow path mold pattern is formed smooth, as illustrated in FIG. 3H, an orifice plate thickness distribution is generated as the final shape. In other words, the orifice plate (flow path forming member) may have a thick part and a thin part.

In FIG. 3H, the thick part of the flow path forming member refers to a part that becomes a partition wall between two liquid flow paths 17 at the center part of FIG. 3H. Further, the thin part of the flow path forming member refers to a part formed thin above the pattern due to the level difference of the pattern 51 of FIG. 3H.

In the vicinity of the part above the level difference of the pattern 51, the thickness of the orifice plate tends to be reduced. Therefore, the strength is desired to be improved, and hence the taper angle is desired to be gentle (θ: large). On the other hand, when the part that becomes the partition wall between the liquid flow paths is tapered, the flow path sectional area may accordingly reduce to increase the flow path resistance. Therefore, it is desired that the partition wall between the liquid flow paths be less tapered.

Therefore, in this embodiment, a side wall on the outer circumference side of the liquid flow path (also referred to as outer circumference side wall), which tends to be formed above the pattern 51, is formed with a taper angle. Further, in this embodiment, a side wall on the inner circumference side forming the partition wall between the liquid flow paths (also referred to as inner circumference side wall) is formed almost perpendicular (substantially perpendicular) to the substrate surface.

In this embodiment, the following modes are particularly described. That is to say, the flow path forming member has a configuration including the partition wall between the liquid flow paths, and each of the liquid flow paths includes the inner circumference side wall forming the partition wall and the outer circumference side wall. Further, the flow path mold pattern includes an inner side surface for forming the inner circumference side wall and an outer side surface for forming the outer circumference side wall, and the outer side surface is formed with the taper angle.

Now, this embodiment is described.

First, as illustrated in FIG. 3A, on the substrate 11, similarly to the first embodiment, the first layer 21 made of the first photosensitive resin is formed. Subsequently, the second layer 31 made of the second photosensitive resin capable of reducing transmission of light having a photosensitive wavelength of the first photosensitive resin is formed.

Figure 3B:
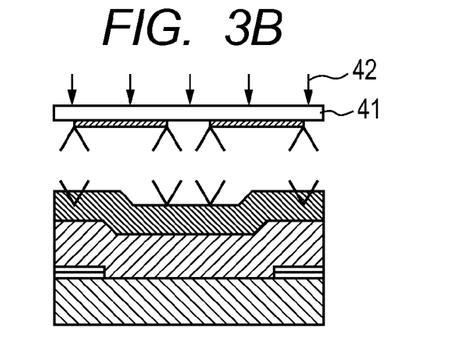

Next, as illustrated in FIG. 3B, the second layer 31 made of the second photosensitive resin is subjected to second exposure treatment.

Figures 3C, 3G:
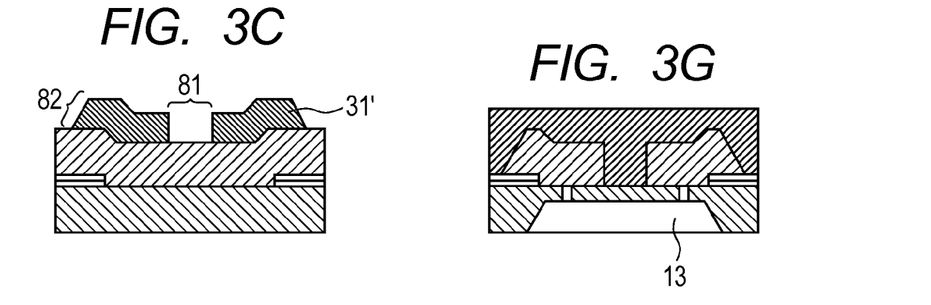

Next, as illustrated in FIG. 3C, the second layer subjected to the second exposure treatment is subjected to the second development treatment to form the mask layer 31'.

The second exposure treatment can be performed in a manner that the second exposure light 42 is applied via the mask 41 by the most widely-used i-line (365 nm) stepper having high alignment accuracy so that the side surface part is provided with a light transmission distribution.

The exposed second layer is developed in the second development treatment to pattern the second layer 31. Thus, the mask layer 31' is formed.

In FIG. 3C, a side surface part 82 of the mask layer 31' has a light transmission distribution, and a side surface part 81 thereof is formed substantially perpendicular to the substrate surface. That is to say, in the mask layer 31', the inner side surface of the flow path mold pattern is formed substantially perpendicular to the substrate surface, and the outer side surface of the flow path mold pattern is formed with a taper angle.

As a method of achieving the transmission distribution of the side surface part, as described above, there is known a method of controlling the imaging position in projection exposure. When it is necessary to provide a taper for stress relaxation only in the part in which the orifice plate becomes thin, a predetermined imaging position is set at a lower surface position (orifice plate thick position) from the viewpoint of ink flow path resistance. Thus, in a part having a high surface position, such an exposure that the imaging position is more shifted from the front surface can be achieved. Therefore, the taper can be formed gentler (θ: large). Therefore, it is preferred that the imaging position be set at a low surface position or at a position closer to the substrate than that position.

Figure 3D:
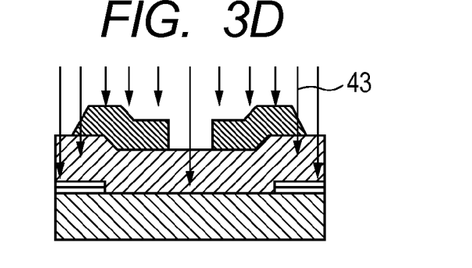

Subsequently, as illustrated in FIG. 3D, with use of the mask layer 31' as a mask, the first layer 21 is subjected to the first exposure treatment with light having a photosensitive wavelength of the first photosensitive resin.

Figure 3E:
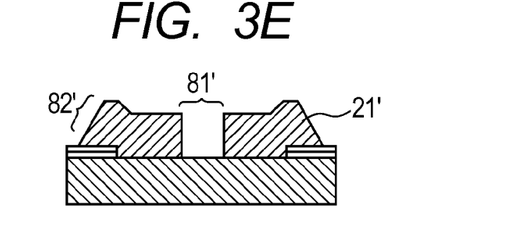

Next, as illustrated in FIG. 3E, the first layer subjected to the first exposure treatment is subjected to the first development treatment, to thereby form the flow path mold pattern 21'.

In the side surface part 82 of the mask layer 31', absorption occurs in proportion to the film thickness distribution, and hence an exposure amount distribution is provided in the first layer 21. When the exposure amount distribution is provided, the thickness of the photosensitive resin is reduced in accordance with the exposure amount. Therefore, the outer side surface (82') of the flow path mold pattern can be formed into a tapered shape with a taper angle θ (95°<θ) by the development treatment. The inner side surface (81') of the flow path mold pattern is formed substantially perpendicular to the substrate, and the angle is, for example, 86° to 94°, preferably 88° to 92°, more preferably 89° to 91°.

Figure 3F:
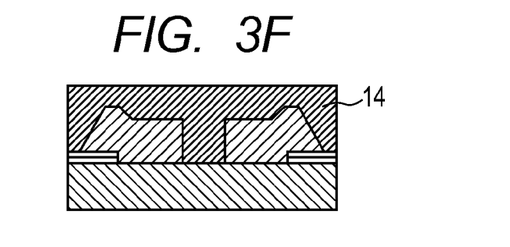
Figure 3H:
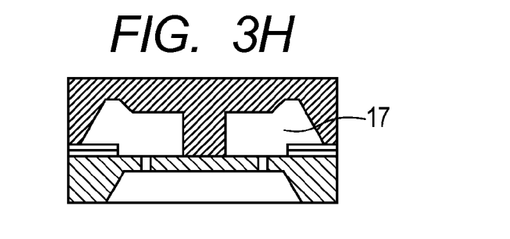

Subsequently, as illustrated in FIG. 3F, the coating resin layer is formed with use of a photosensitive resin, and the coating resin layer is patterned. Thus, the flow path forming member having the ejection orifice is formed.

Subsequently, as illustrated in FIG. 3G, as described in the first embodiment, the liquid supply port is formed.

Then, as illustrated in FIG. 3H, the flow path mold pattern is removed, and then a curing step is carried out.

With the above-mentioned steps, it is possible to produce a liquid ejection head in which a taper angle for stress relaxation is provided to a part in which the orifice plate is thinned and cracks may occur.

Third Embodiment $l_{ieR} \in \{obj, bkg\}$

FIGS. 4A to 4I are sectional views illustrating steps of a producing process according to a third embodiment of the present invention, and are schematic sectional views taken along the line 1B-1B of FIG. 1A. In the following, this embodiment is described with reference to FIGS. 4A to 4I.

$l_{ieR} \in \{obj, bkg\}$

This embodiment is effective in a case where the flow path sectional area is limited, and is a mode capable of defining the start point and the end point of the tapered shape provided in the flow path mold pattern more effectively.

Figure 4A:
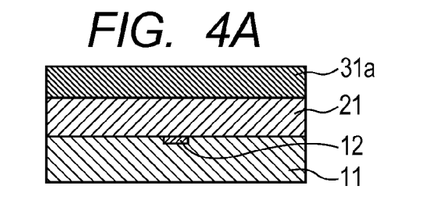
FIGS. 4A, 4B, 4C, 4D, 4E, 4F, 4G, 4H and 4I are sectional views illustrating exemplary steps of a producing process according to a third embodiment of the present invention.

First, as illustrated in FIG. 4A, on the substrate, the first layer 21 made of the first photosensitive resin is provided. Subsequently, a first photosensitive resist layer 31a capable of reducing transmission of light having a photosensitive wavelength of the first photosensitive resin is formed.

Figure 4B:
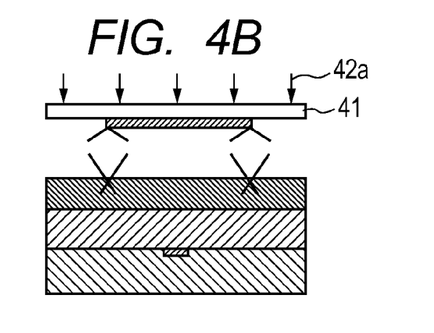

Next, as illustrated in FIG. 4B, the first photosensitive resist layer 31a is subjected to the second exposure treatment via the mask 41.

At this time, it is preferred that the most widely-used i-line (365 nm) stepper having high alignment accuracy be used to apply the second exposure light 42a.

Figure 4C:
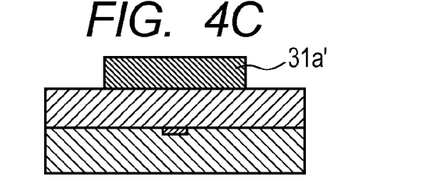

Next, as illustrated in FIG. 4C, the first photosensitive resist layer 31a subjected to the second exposure treatment is subjected to the second development treatment to form a lower layer mask pattern (also referred to as underlying mask pattern) 31a'.

Figure 4D:
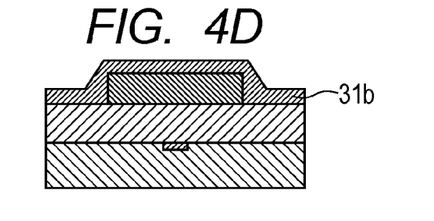

Next, as illustrated in FIG. 4D, a second photosensitive resist layer 31b capable of reducing transmission of light having a photosensitive wavelength of the first photosensitive resin is formed.

Figure 4E:
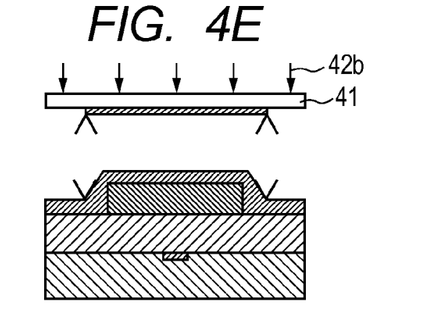

Next, as illustrated in FIG. 4E, the second photosensitive resist layer 31b is subjected to a third exposure treatment.

The second photosensitive resist layer 31b is irradiated with a third exposure light 42b via the mask 41 so that the side surface part is provided with a transmission distribution.

Figure 4F:
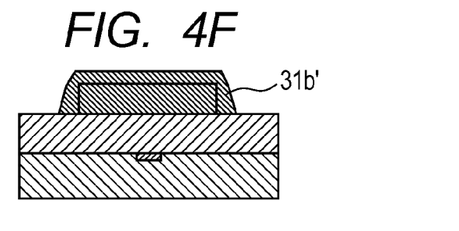

Next, as illustrated in FIG. 4F, the second photosensitive resist layer 31b subjected to the third exposure treatment is subjected to a third development treatment, to thereby form an upper layer mask pattern 31b'.

That is to say, in this embodiment, the mask layer includes at least two layers. Specifically, the mask layer that is used as a mask when the first layer is exposed to light includes the lower layer mask pattern 31a' and the upper layer mask pattern 31b'. The upper layer mask pattern (outermost layer) 31b' realizes the transmission distribution of the side surface part of the mask layer.

Further, in this embodiment, the lower layer mask pattern 31a' has a complete light shielding property with respect to the first exposure treatment. With this, a taper start point 61 of the flow path mold pattern is defined by the lower layer mask pattern corresponding to a complete light shielding portion so as not to reduce the flow path sectional area more than necessary. Further, a taper end point 62 is defined by the upper layer mask pattern.

Further, the absorbance in the complete light shielding region is preferred to be 2 or more in a photosensitive wavelength region of the first photosensitive resin, and is more preferred to be 3 or more. Further, the absorbance in a region from the start point to the end point of the tapered shape is preferred to be less than 2. The absorbance can be controlled by the film thickness or the addition amount of a hydroxybenzophenone compound. The addition amount of the hydroxybenzophenone compound in the lower layer mask pattern may be 5 to 12 parts by mass with respect to 100 parts by mass of the resin material, and is preferred to be 6 to 10 parts by mass. Further, the addition amount of the hydroxybenzophenone compound in the upper layer mask pattern may be 0 to 5 parts by mass with respect to 100 parts by mass of the resin material, and is preferred to be 1 to 3 parts by mass. The same resin material may be used in the lower layer mask pattern and the upper layer mask pattern. The addition amount of the hydroxybenzophenone compound in the upper layer mask pattern is, for example, 0 to 5 parts by mass with respect to 100 parts by mass of the solid content of a naphthoquinone diazide derivative.

Figure 4G:
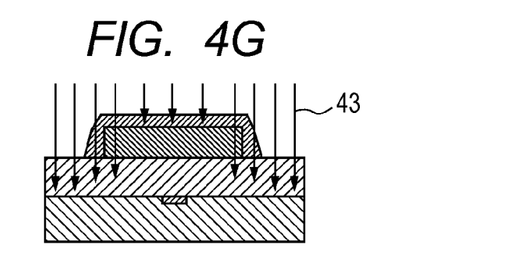

Subsequently, as illustrated in FIG. 4G, the first layer 21 is irradiated with the first exposure light 43 with use of the above-mentioned mask layer to perform the first exposure treatment.

Figure 4H:
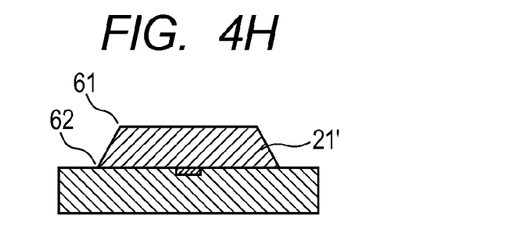
Figure 4I:
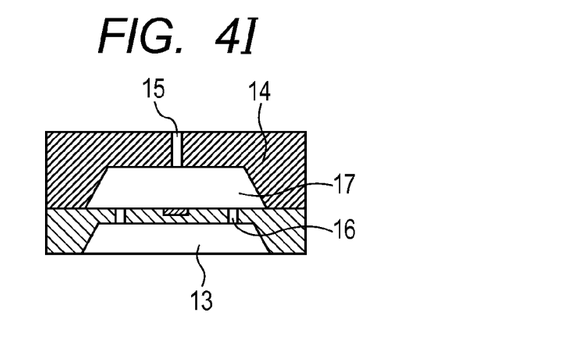

In the side surface part of the mask layer, in other words, the side surface part of the upper layer mask pattern, absorption occurs in proportion to the film thickness distribution, and hence an exposure amount distribution is achieved in the first layer. With the exposure amount distribution, the thickness of the photosensitive resin is reduced in accordance with the exposure amount. Therefore, the flow path mold pattern 21' having a tapered side surface can be obtained through development (FIG. 4H).

The subsequent steps are similar to those of the first embodiment.

EXAMPLE 1

A liquid ejection head was produced in accordance with the following steps. Note that, FIGS. 2A to 2H are sectional views of steps taken along the line 1B-1B of FIG. 1A. In the following, a specific production process according to this example is described.

First, as illustrated in FIG. 2A, on the substrate 11 having the ejection energy generating element 12 and a semiconductor element for driving and controlling the ejection energy generating element 12 provided thereon, the first layer made of the first positive photosensitive resin is formed.

Specifically, ODUR-1010 (product name, produced by TOKYO OHKA KOGYO CO., LTD.) is applied by spin coating to have a thickness of 5 μm, and then dried. Thus, the first layer 21 is formed.

Next, also as illustrated in FIG. 2A, the second layer 31 made of the second photosensitive resin is formed.

Specifically, THMR-iP5700 (product name, produced by TOKYO OHKA KOGYO CO., LTD.) is applied to have a thickness of 4 μm, and then dried. Thus, the second layer 31 is formed.

It is preferred that 5 to 12 parts by mass of a hydroxybenzophenone compound be contained with respect to 100 parts by mass of the solid content of THMR-iP5700.

Next, as illustrated in FIG. 2B, the second layer 31 is subjected to the first exposure treatment.

Specifically, a stepper FPA-3000i5+ (product name) manufactured by Canon Inc. is used to irradiate the second layer 31 with the first exposure light 42.

The exposure conditions were set as follows. The numerical aperture (NA) was 0.63 and the coherence factor (σ) was 0.65. The imaging position was set at a position close to the substrate side by 10 μm with respect to the front surface (top surface) of the second layer 31. The exposure amount was set to 3,000 J/m².

Next, as illustrated in FIG. 2C, the first development treatment is performed to form the mask layer 31' in which the side surface part thereof has a light transmission distribution.

Specifically, 2.38 mass % of a tetramethyl ammonium aqueous solution is used for development to form the mask layer 31' in which the side surface part thereof has a light transmission distribution.

Next, as illustrated in FIG. 2D, the first layer 21 is subjected to second exposure treatment with use of the mask layer 31' as a mask.

Specifically, for applying an ultraviolet ray in a range of a photosensitive wavelength of the first layer via the mask layer 31', pattern irradiation of a deep-UV light was conducted using a mask aligner UX-3000SC (product name) manufactured by Ushio Inc at 20 J/cm² by.

Next, as illustrated in FIG. 2D, the first layer is subjected to the second development treatment.

Specifically, development is performed by a processing device (CDS-8000) with use of methyl isobutyl ketone, and rinsing is performed with use of isopropyl alcohol, to thereby form the flow path mold pattern 21' and simultaneously remove the mask layer 31'. When $\theta_2$ represents a taper angle between the top surface and the side surface in a cross section of the obtained flow path mold pattern 21' perpendicular to the substrate surface, $\theta_2$ was 110°.

Next, as illustrated in FIG. 2F, on the flow path mold pattern 21', the flow path forming member having the ejection orifice 15 is formed.

Specifically, on the flow path mold pattern 21', a negative photosensitive resin is applied by spin coating to have a thickness of 8 μm, and then dried. The negative photosensitive resin contains 100 parts of EHPE-3150 (product name, produced by Daicel Corporation), 5 parts of A-187 (produced by NUC Corporation), 2 parts of SP-170 (produced by ADEKA CORPORATION), and 80 parts of xylene. After that, a stepper FPA-3000i5+(product name) manufactured by Canon Inc. is used to perform ultraviolet ray exposure. Subsequently, post baking and development with a mixed liquid of methyl isobutyl ketone/xylene=⅔ are performed. In this manner, an unexposed portion is removed, and thus the flow path forming member having the ejection orifice is formed.

After that, in order to protect the orifice plate, the front surface side and the periphery of the side surface of the substrate are coated with a rubber resin to from a protective layer (not shown).

Next, as illustrated in FIG. 2G, etching is performed from the rear surface (second surface) side of the substrate to form the liquid supply port.

Specifically, with use of a polyether amide layer provided on the rear surface of the substrate as a mask and 22 mass % of tetramethyl ammonium hydroxide (TMAH) as an etchant, crystal anisotropic etching of silicon is performed to form a common liquid chamber. Subsequently, with use of a pattern mask formed on a bottom surface of a recessed portion of the common liquid chamber, dry etching is performed to form the independent supply ports.

Next, as illustrated in FIG. 2H, the flow path mold pattern 21' is removed.

Specifically, the substrate is irradiated with an ultraviolet ray in a range of the photosensitive wavelength, and methyl lactate is used to dissolve and remove the flow path mold pattern.

After that, a curing step is performed at 200° C. for one hour.

With the above-mentioned steps, the liquid ejection head was produced.

The produced liquid ejection head was evaluated in terms of misalignment amount, taper angle, and cracks.

Figure 5A:
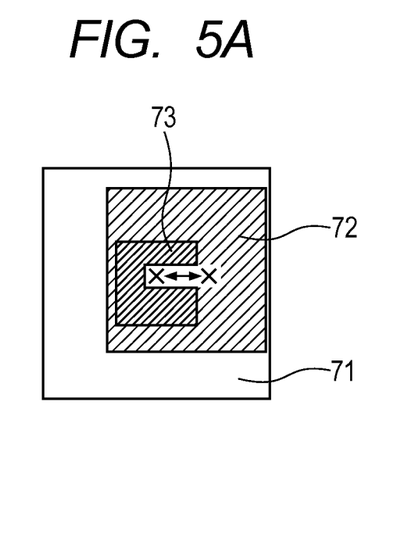
FIGS. 5A and 5B are explanatory views schematically illustrating an evaluation method of Example and Comparative Examples of the present invention.

The misalignment amount between the flow path mold pattern and the ejection orifice was evaluated with use of a pattern for alignment accuracy as illustrated in FIG. 5A. Comparison is made based on the misalignment amount among the center of a pattern 71 formed on the substrate, the center of a pattern 72 formed simultaneously with the flow path mold pattern, and the center of a pattern 73 formed simultaneously with the ejection orifice.

Figure 5B:
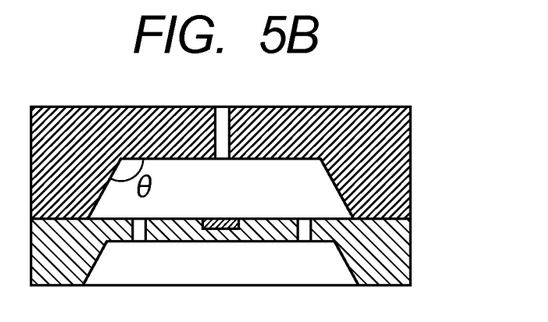

Further, as for the taper angle, the angle of the edge portion of the flow path (FIG. 5B) was measured.

Further, as for the cracks, two-fluid jet of nitrogen and water was used to apply a pressure of 0.3 MPa, and generation of cracks in the orifice plate was observed.

The results of the above are shown in Table 1.

Comparative Example 1 had a good positional accuracy, but cracks were generated due to the external force. In Comparative Example 2, cracks were not generated, but there was a problem in positional accuracy. As compared thereto, the head produced in the present invention maintained high positional accuracy, and cracks were not generated.

TABLE 1

|  | Direction | Example 1 | Comparative Example 1 | Comparative Example 2 |
|---|---|---|---|---|
| Mold pattern misalignment amount | X direction | ±0.0 μm | ±0.0 μm | +1.0 μm |
|  | Y direction | ±0.0 μm | ±0.0 μm | −2.0 μm |
| Ejection orifice | X direction | ±0.0 μm | ±0.0 μm | ±0.0 μm |
|  | Y direction | ±0.0 μm | ±0.0 μm | ±0.0 μm |
| Flow path taper angle |  | 110° | 92° | 110° |
| Crack test result |  | No cracks | Cracks | No cracks |

COMPARATIVE EXAMPLE 1

Comparative Example 1 is described with reference to FIGS. 6A to 6F.

Figure 6A:
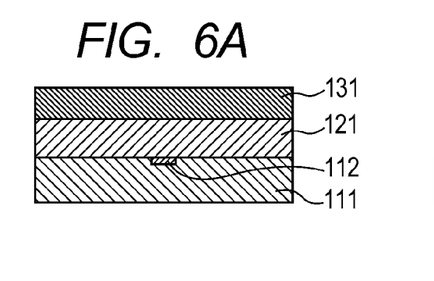
FIGS. 6A, 6B, 6C, 6D, 6E and 6F are sectional views illustrating production steps in Comparative Example 1 of the present invention.

First, similarly to Example 1, on a substrate 111 provided with an ejection energy generating element 112, a first layer 121 made of a first photosensitive resin is provided. Subsequently, a second layer 131 capable of reducing transmission of light having a photosensitive wavelength of the first photosensitive resin is formed (FIG. 6A).

Figures 6B, 6F:
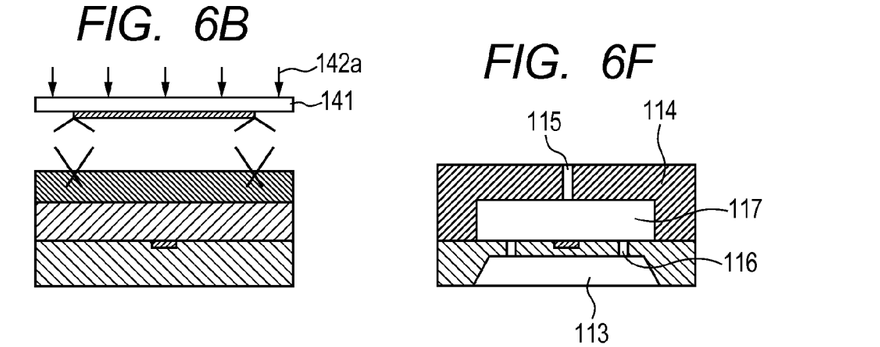

Next, the second layer is exposed to an ultraviolet ray (142a) with use of a stepper (FIG. 6B). The exposure conditions are set as follows. The numerical aperture (NA) is 0.63 and the coherence factor ($\sigma$) is 0.65. The imaging position is set to the front surface of the second layer 31. The exposure amount is set to 3,000 J/m².

Figure 6C:
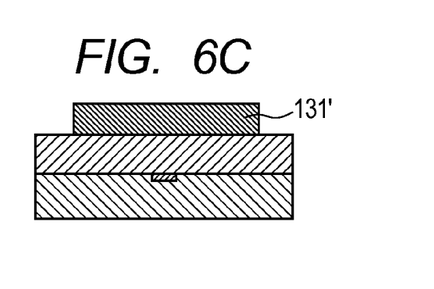

Next, development is performed with use of 2.38 mass % of a tetramethyl ammonium aqueous solution to form a mask layer 131' (FIG. 6C).

Figure 6D:
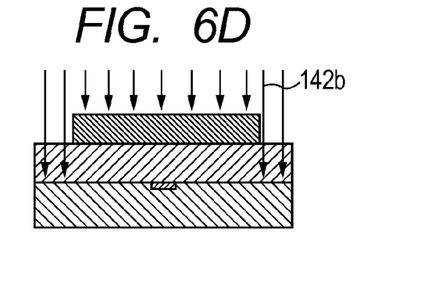

Next, pattern irradiation of an ultraviolet ray (deep-UV light) 142b in a range of a photosensitive wavelength of the first layer 121 is conducted via the mask layer 131' by a mask aligner UX-3000SC (product name) manufactured by Ushio Inc. at 20 J/cm² (FIG. 6D).

Figure 6E:
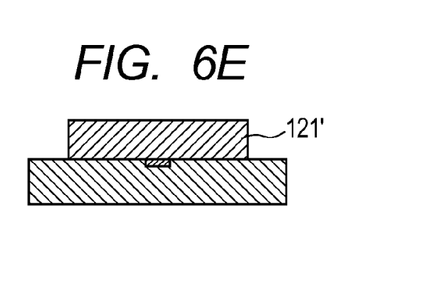

Next, development is performed by the processing device (CDS-8000) with use of methyl isobutyl ketone, and rinsing is performed with use of isopropyl alcohol, to thereby form a flow path mold pattern 121' having a vertical shape in the edge portion and simultaneously remove the mask layer 31' (FIG. 6E).

Next, similarly to Example 1, a flow path forming member 114 having an ejection orifice 115 is formed. Further, etching is performed from the rear surface of the substrate to form a common liquid chamber 113 and independent supply ports 116. Thus, the liquid ejection head is produced (FIG. 6F).

With the above-mentioned steps, the liquid ejection head according to Comparative Example 1 was produced.

COMPARATIVE EXAMPLE 2

Figure 7A:
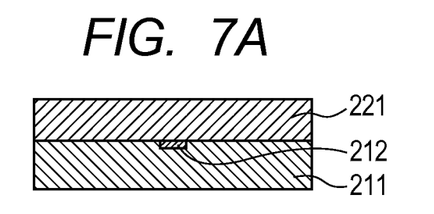
FIGS. 7A, 7B, 7C and 7D are sectional views illustrating production steps in Comparative Example 2 of the present invention.

Similarly to Example 1, on a substrate 211 provided with an ejection energy generating element 212, a first layer 221 is formed of a photosensitive resin layer (FIG. 7A).

Figure 7B:
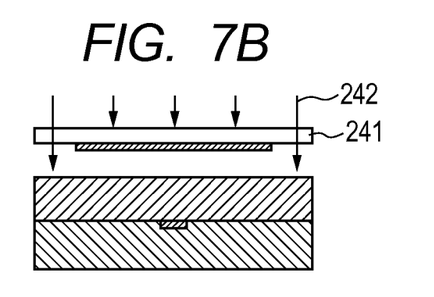

Next, the first layer 221 is subjected to proximity exposure with deep-UV light 242 via a mask 241 at 20 J/cm² by a mask aligner UX-3000SC (product name) manufactured by Ushio Inc (FIG. 7B).

Next, development is performed by the processing device (CDS-8000) with use of methyl isobutyl ketone, and rinsing is performed with use of isopropyl alcohol.

Figure 7C:
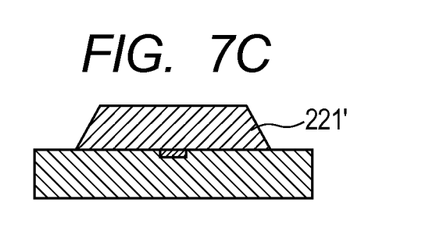

Because proximity exposure is performed, a flow path pattern 221' having a tapered edge is formed (FIG. 7C), as compared to Comparative Example 1.

Figure 7D:
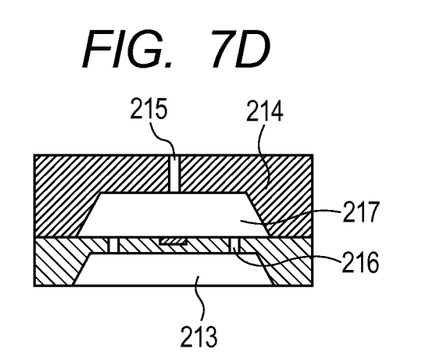

Subsequently, similarly to Example 1, the ejection orifice is formed, and a substrate rear surface step is performed. Thus, the liquid ejection head according to Comparative Example 2 is produced (FIG. 7D).

According to the present invention, it is possible to provide a process for producing a liquid ejection head, which is capable of controlling the position of the liquid flow path with high accuracy and capable of relaxing stress concentration to prevent generation of cracks.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-000582, filed Jan. 7, 2013, which is hereby incorporated by reference herein in its entirety.

What is claimed is:

1. A process for producing a liquid ejection head including, on a substrate, a flow path forming member that forms an ejection orifice for ejecting liquid and a liquid flow path communicating with the ejection orifice, the process comprising:
    (1) forming, on the substrate, a first layer made of a first photosensitive resin;
    (2) forming, on the first layer, a mask layer in which at least a part of a side surface part of the mask layer has a light transmission distribution with use of a material capable of reducing transmission of light having a photosensitive wavelength of the first photosensitive resin;
    (3) performing, for the first layer, a first exposure treatment with use of the mask layer as a mask and a first development treatment to form a flow path mold pattern that forms a mold of the liquid flow path, the flow path mold pattern having a taper angle θ that satisfies 95°<θ, where θ is the angle between a top surface and a side surface in a cross section of the flow path mold pattern perpendicular to a surface of the substrate;
    (4) forming a coating resin layer so as to cover the flow path mold pattern;
    (5) patterning the coating resin layer so as to form the flow path forming member having the ejection orifice; and
    (6) removing the flow path mold pattern to form the liquid flow path.

2. A process for producing a liquid ejection head according to claim 1,
    wherein the step (2) comprises:
        forming, on the first layer, a second layer made of a second photosensitive resin capable of reducing the transmission of the light having the photosensitive wavelength of the first photosensitive resin; and
        performing a second exposure treatment and a second development treatment for the second layer to form the mask layer, and
    wherein the second exposure treatment comprises a treatment that performs imaging exposure in a manner that an imaging position is shifted from a front surface of the second layer toward the substrate side.

3. A process for producing a liquid ejection head according to claim 1,
    wherein the flow path forming member includes a partition wall provided between the liquid flow path and the liquid flow path,
    wherein the liquid flow path includes an inner circumference side wall forming the partition wall and an outer circumference side wall,
    wherein the flow path mold pattern includes an inner side surface for forming the inner circumference side wall and an outer side surface for forming the outer circumference side wall, and
    wherein the outer side surface is formed to have the taper angle.

4. A process for producing a liquid ejection head according to claim 3, wherein the inner side surface is formed substantially perpendicular to the surface of the substrate.

5. A process for producing a liquid ejection head according to claim 1, wherein the mask layer includes at least two layers.

6. A process for producing a liquid ejection head according to claim 1, wherein the first photosensitive resin includes a positive photosensitive resin.

* * * * *